US010891848B2

(12) United States Patent
McNulty et al.

(10) Patent No.: US 10,891,848 B2
(45) Date of Patent: Jan. 12, 2021

(54) SYSTEM AND METHOD FOR VOLTAGE DETECTION AND COMMUNICATION BETWEEN ELECTRIC FIELD DETECTORS

(71) Applicant: Greenlee Tools, Inc., Rockford, IL (US)

(72) Inventors: William John McNulty, Washington, DC (US); Michael Standiford, Libertyville, IL (US); Eli Alexander Johnson, Ooltewah, TN (US)

(73) Assignee: GREENLEE TOOLS, INC., Rockford, IL (US)

(*) Notice: Subject to any disclaimer, the term of this patent is extended or adjusted under 35 U.S.C. 154(b) by 596 days.

(21) Appl. No.: 15/581,780

(22) Filed: Apr. 28, 2017

(65) Prior Publication Data

US 2018/0315289 A1  Nov. 1, 2018

(51) Int. Cl.
| G08B 21/18 | (2006.01) |
| G01R 19/165 | (2006.01) |
| G08B 7/06 | (2006.01) |
| G01R 29/08 | (2006.01) |
| G08B 5/22 | (2006.01) |
| G08B 3/00 | (2006.01) |

(Continued)

(52) U.S. Cl.
CPC ........ *G08B 21/182* (2013.01); *G01R 29/0857* (2013.01); *G08B 3/00* (2013.01); *G08B 5/00* (2013.01); *G08B 5/223* (2013.01); *G08B 7/06* (2013.01); *H02H 7/20* (2013.01); *H02H 7/222* (2013.01); *H04W 84/18* (2013.01)

(58) Field of Classification Search
CPC ........ G08B 21/18; G08B 21/182; G08B 7/06; G08B 5/00; G08B 5/223; G01R 29/08; G01R 29/0807; G01R 29/0814; G01R 29/085; G01R 29/0857; H02H 7/20
See application file for complete search history.

(56) References Cited

U.S. PATENT DOCUMENTS

| 4,714,915 A | 12/1987 | Hascal |
| 5,001,455 A | 3/1991 | Starchevich |

(Continued)

FOREIGN PATENT DOCUMENTS

| EP | 1296150 | 3/2003 |
| EP | 2746784 | 8/2016 |

(Continued)

OTHER PUBLICATIONS

Extended European Search Report for corresponding patent application No. 18166715.5, dated Aug. 30, 2018, 7 pages.

(Continued)

*Primary Examiner* — Huy Q Phan
*Assistant Examiner* — David B Frederiksen
(74) *Attorney, Agent, or Firm* — Klintworth & Rozenblat IP LLP (57) ABSTRACT

An electric field detector includes field detection circuitry configured to detect voltage in an electric field in an environment and configured to determine if the voltage meets or exceeds a voltage threshold. A warning module operably connected with the field detection circuitry is configured to provide a warning to operators in the environment. A communication module operably connected with the field detection circuitry communicates a warning notification to another electric field detector.

10 Claims, 7 Drawing Sheets

(51) Int. Cl.
*G08B 5/00* (2006.01)
*H02H 7/20* (2006.01)
*H04W 84/18* (2009.01)
*H02H 7/22* (2006.01)

(56) References Cited

U.S. PATENT DOCUMENTS

| | | | | |
|---|---|---|---|---|
| 5,814,968 | A * | 9/1998 | Lovegreen | H01M 2/1022 320/113 |
| 6,170,607 | B1 | 1/2001 | Freeman et al. | |
| 6,329,924 | B1 | 12/2001 | McNulty | |
| 6,677,743 | B1 | 1/2004 | Coolidge et al. | |
| 6,788,215 | B1 | 9/2004 | White | |
| 6,998,832 | B1 | 2/2006 | McNulty | |
| D577,300 | S | 9/2008 | Radecke et al. | |
| D622,956 | S | 9/2010 | Hoffman | |
| D650,116 | S | 12/2011 | Buyce et al. | |
| 8,786,447 | B1 * | 7/2014 | Wise | G01R 29/0857 340/573.4 |
| 9,116,178 | B1 | 8/2015 | Czarnecki | |
| 9,215,394 | B2 | 12/2015 | Barnett et al. | |
| 9,265,331 | B1 | 2/2016 | Hoffman | |
| 2004/0080320 | A1 | 4/2004 | Golub | |
| 2005/0040809 | A1 | 2/2005 | Uber, III et al. | |
| 2005/0264427 | A1 | 12/2005 | Zeng et al. | |
| 2006/0186872 | A1 | 8/2006 | Trethewey | |
| 2006/0192545 | A1 * | 8/2006 | Karagiannis | G01R 29/0864 324/72.5 |
| 2007/0018841 | A1 | 1/2007 | Nickerson | |
| 2007/0236358 | A1 * | 10/2007 | Street | G08B 1/08 340/628 |
| 2009/0108840 | A1 * | 4/2009 | Givens | G01R 29/085 324/251 |
| 2010/0052929 | A1 * | 3/2010 | Jacket | G01R 29/085 340/660 |
| 2013/0010110 | A1 | 1/2013 | Kalokitis et al. | |
| 2014/0184425 | A1 | 7/2014 | Smith et al. | |
| 2015/0091735 | A1 * | 4/2015 | McNulty | A61B 5/0006 340/660 |
| 2010/5323580 | | 11/2015 | Olson et al. | |
| 2015/0323580 | A1 * | 11/2015 | Olson | G01V 3/10 324/207.22 |
| 2016/0209445 | A1 * | 7/2016 | McCammon | H02N 2/181 |
| 2017/0045571 | A1 * | 2/2017 | Joseph | G01R 31/085 |
| 2017/0205454 | A1 | 7/2017 | Rachakonda et al. | |
| 2018/0336776 | A1 * | 11/2018 | Liu | G01J 1/0271 |

FOREIGN PATENT DOCUMENTS

| | | |
|---|---|---|
| EP | 3124983 | 2/2017 |
| WO | 99/13698 | 3/1999 |
| WO | 2016014260 | 1/2016 |

OTHER PUBLICATIONS

"Snap Engine SM220 Series," Digi-Key Part No. 746-1053-1-ND, Catalog No. SM220UF1 synapse Wireless / RF/IF and RFID /DigiKey, http://www.digikey.com/product-detail/en/synapse-wirelessSM220Uf1/746-1053-1-ND/5 . . ., 1995-2016, 2 pages.

"Choose your RF Module," RF Modules / Synapse Wireless, http://www.synapse-wireless.com/iot-products/core-iot/rf-modules/, Nov. 23, 2015, 2 pages.

"Hi Volt Alert System," Atlas Polar Company Ltd., Toronto, ON, Canada, http://http://www.atlaspolar.com/media/material-handling-equipment/hivolt-alert/brochures/HiVolt-Alert-Equipment.pdf, Aug. 4, 2016, 2 pages.

"HVPS-110-W Wireless High Voltage Proximity Alarm," Semrad pty Ltd., Engadine New South Wale, Australia, http://www.semrad.com.au/pdf/safe_systems/Sigalarm_Wireless_High_Voltage_Proximity_Alarm.pdf, Mar. 21, 2015, 4 pages.

Design U.S. Appl. No. 29/563,315, filed May 4, 2016.

Office Action for U.S. Appl. No. 15/963,294 dated Sep. 20, 2019, 5 pages.

Office Action for corresponding European patent application No. 18166715.5, dated Aug. 8, 2019, 5 pages.

Extended European Search Report from European Application No. 18169718.6 dated Oct. 5, 2018, 7 pages.

Brochure: "Sound Permeable Waterproof Film," Seiren Co., LTD., Osaka, Japan, www.seiren.com/seiren, 2014, 1 page.

Webpage: "Personal Voltage Detector," HD Electric Co., Waukegan, IL, USA, http://www.hdelectriccompany.com/hd-electric--products/etm/personal-voltage-detectors/v-watch.htm, 2001, 3 pages.

Webpage: "P796 Mini Tube Cord Lock 1/8 Inch," Best Buy Button & Buckle, http://cord-lock.com/p796-mini-tube-cord-ock.aspx, 2009, 2 pages.

Webpage: "V-Watch Personal Voltage Detectors," HD Electric Co., Waukegan, IL, USA, http:/www.hdelectriccompany.com/assets/files/V-Watch%20Personal%20Personal%20Voltage%20Detectors%20Literature.pdf, 2015, 2 pages.

Machine translation of EP 3124983 A1.

Final Office Action from U.S. Appl. No. 15/963,294 dated Mar. 19, 2020, 29 pages.

Notice of Allowance for U.S. Appl. No. 15/963,294 dated Sep. 15, 2020, 9 pages.

* cited by examiner

SYSTEM AND METHOD FOR VOLTAGE DETECTION AND COMMUNICATION BETWEEN ELECTRIC FIELD DETECTORS

FIELD OF THE DISCLOSURE

The present disclosure generally relates to voltage detection by an electric field detector in an environment, and more particularly relates to detecting the presence of voltage exceeding a voltage threshold and communicating the detection between electric field detectors to provide a warning to operators within the environment of the voltage exceeding the voltage threshold.

BACKGROUND

Reliably detecting high voltage on distribution and transmission voltage power lines is critical to the jobs performed by electric utility linemen. These jobs are performed more quickly and safely when the voltage detection is also convenient and easy to use.

SUMMARY

In an embodiment, an electric field detector is provided in an environment. The electric field detector includes field detection circuitry configured to detect a voltage in an electric field in the environment which meets or exceeds a voltage threshold, a warning module operably connected with the field detection circuitry and configured to provide a warning to operators based on the voltage meeting or exceeding the voltage threshold, and a communication module operably connected with the field detection circuitry and configured to wirelessly communicate a warning notification to a second electric field detector that a voltage meeting or exceeding the voltage threshold is present.

In an embodiment, a system is provided in an environment. The system includes a first electric field detector including a communication module, and a second electric field detector including field detection circuitry configured to detect a voltage in an electric field in the environment which meets or exceeds a voltage threshold, a warning module operably connected with the field detection circuitry and configured to provide a warning to operators based on the voltage meeting or exceeding the voltage threshold, and a communication module operably connected with the field detection circuitry and configured to wirelessly communicate a warning notification to the first electric field detector that a voltage meeting or exceeding the voltage threshold is present.

In an embodiment, a method for providing a warning to operators is provided. The method includes determining, by field detection circuitry of a first electric field detector in an environment, whether an electric field meeting or exceeding a voltage threshold is present, providing a warning in response to a determination that an electric field meeting or exceeding a voltage threshold is present, determining whether a warning notification has been received from a second electric field detector in the environment indicating that the second electric field detector has detected an electric field meeting or exceeding a voltage threshold, and providing a warning by the first electric field detector in response to a determination that a warning notification has been received from the second electric field detector in the environment.

This Summary is provided merely for purposes of summarizing some example embodiments so as to provide a basic understanding of some aspects of the disclosure. Accordingly, it will be appreciated that the above described example embodiments are merely examples and should not be construed to narrow the scope or spirit of the disclosure in any way. Other embodiments, aspects, and advantages of various disclosed embodiments will become apparent from the following detailed description taken in conjunction with the accompanying drawings, which illustrate, by way of example, the principles of the described embodiments.

BRIEF DESCRIPTION OF THE DRAWINGS

The organization and manner of the structure and operation of the disclosed embodiments, together with further objects and advantages thereof, may best be understood by reference to the following description, taken in connection with the accompanying drawings, which are not necessarily drawn to scale, wherein like reference numerals identify like elements in which.

DETAILED DESCRIPTION OF THE ILLUSTRATED EMBODIMENTS

While the disclosure may be susceptible to embodiment in different forms, there is shown in the drawings, and herein will be described in detail, a specific embodiment with the understanding that the present disclosure is to be considered an exemplification of the principles of the disclosure, and is not intended to limit the disclosure to that as illustrated and described herein. Therefore, unless otherwise noted, features disclosed herein may be combined together to form additional combinations that were not otherwise shown for purposes of brevity. It will be further appreciated that in some embodiments, one or more elements illustrated by way of example in a drawing(s) may be eliminated and/or substituted with alternative elements within the scope of the disclosure. Directional terms, such as upper, lower, top, bottom, vertical and horizontal, are used herein for ease in description; this does not denote a required orientation during use.

In some embodiments, the systems and methods describe electric field detectors 20a-d applied to an environment 10, which may be a physical structure or may be a section of the ground. In some embodiments, each electric field detector 20a-d is configured to detect voltage in an electric field in the environment 10 and to determine whether the detected voltage meets or exceeds a voltage threshold. In some embodiments, each electric field detector 20a-d is configured to detect voltage in an electric field in the environment 10 and to determine whether the detected voltage meets or exceeds one or more voltage thresholds. In response to the detection by the electric field detectors 20a-d that the detected voltage meets or exceeds a voltage threshold (hereinafter called an "overvoltage"), the electric field detectors 20a-d provide a warning to the operators. In response to the detection of overvoltage by one or more of the electric field detectors 20a-d, the electric field detectors 20a-d are configured to communicate a warning notification of the detection of the overvoltage to the other electric field detectors 20a-d in the system. In an embodiment, the voltage threshold is 236 Volts or greater, e.g., at 50 Hz/60 Hz. The electric field detectors 20a-d are configured to receive the warning notification and provide a warning, for example, a visual and/or audio warnings, to operators of the presence of the overvoltage in the electric field of the environment 10. As used herein, the term "operator" or "operators" means a person or persons proximate to, or within, the environment 10. In some embodiments, the electric field detectors 20a-d detect alternating current (AC) voltage.

Figure 1A:
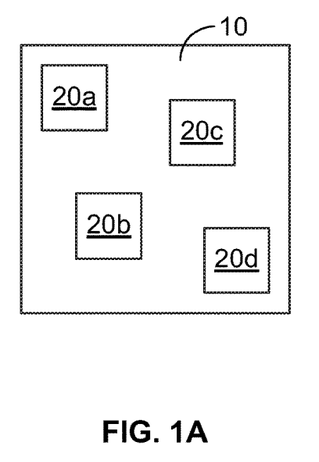
FIGS. 1A and 1B are example environments for positioning a system of electric field detectors.
Figure 1B:
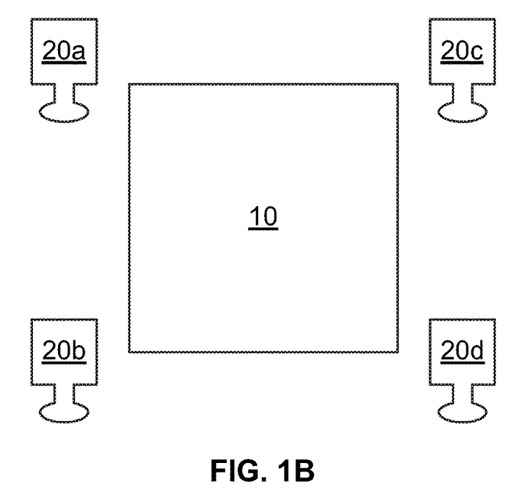

While a system providing four electric field detectors 20a-d is shown in FIGS. 1A and 1B, this is not limiting. The system requires at least two electric field detectors for operation of communication and coordinated warnings, but as many electric field detectors as needed may be used. FIGS. 1A and 1B illustrate example environments 10 for placing electric field detectors 20a-d, e.g., in a grouping to detect voltage within the environment 10.

The electric field detectors 20a-d can be positioned in a variety of places in, on and around the environment 10. At least one or more of the electric field detectors 20a-d can be placed in clear view of the operators working in the environment 10, for example, by placing an electric field detector 20a-d on each side of the environment 10. For example, in an embodiment, the electric field detectors 20a-d can be positioned at a front of the environment 10, at a rear of the environment 10, on the sides of the environment 10, in high, medium and/or low positions in and around the environment 10 relative to the ground, and/or in other spatial arrangements that disperse the electric field detectors 20a-d to provide voltage detection coverage throughout the environment 10 and the ability of workers to view/hear one or more electric field detectors 20a-d throughout the environment 10. In this way, the electric field detectors 20a-d can detect voltage up above the environment 10, down between the environment 10 and the ground, and/or on all sides of the environment 10, as determined by positioning the electric field detectors 20a-d. Additional and alternative positions to those illustrated in FIGS. 1A and 1B can be used.

Depending on structural implementation and/or an operator selected deployment configuration, the electric field detectors 20a-d can be configured to be fixedly mounted or removably mounted in the environment 10.

Figure 2:
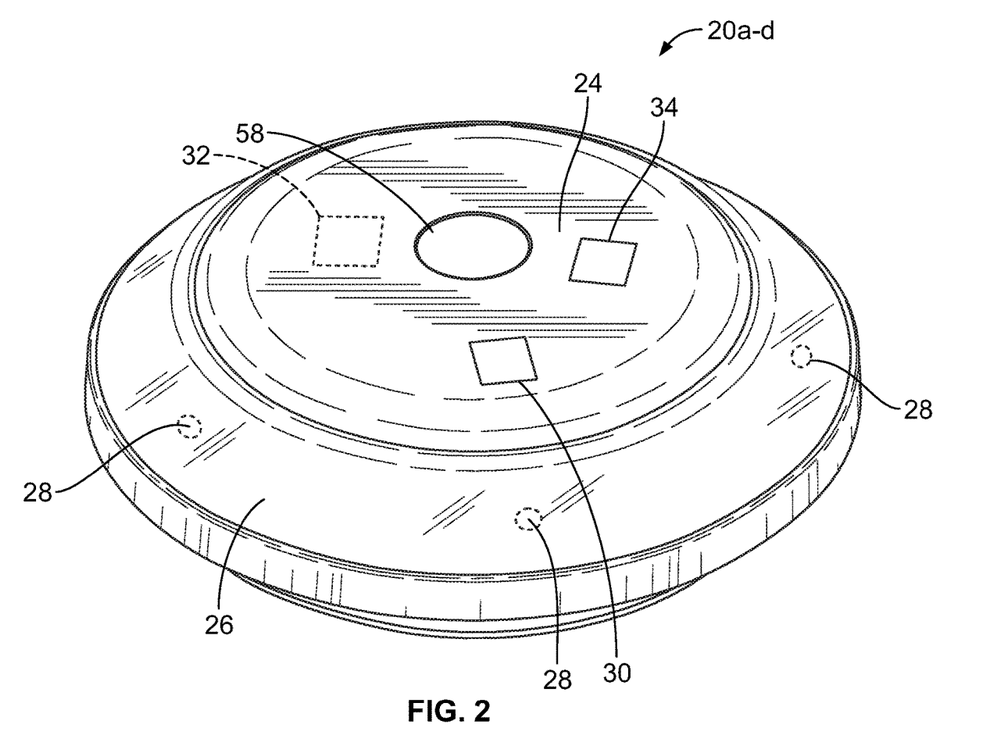
FIG. 2 is a perspective view of an example electric field detector.

In an embodiment, one or more of the electric field detectors 20a-d includes a housing 24 having a transparent or translucent cover 26, and the one or more illumination sources 28 mounted within the housing 24 under the cover 26 to provide a visual warning to the operators that the electric field detector 20a-d has detected an overvoltage. Non-limiting examples of an illumination source 28 includes, but is not limited to, light emitting diodes (LEDs), incandescent bulbs, gas-based lamps, etc. The cover 26 protects and diffuses light from the one or more illumination sources 28. Additionally, or alternatively, one or more of the electric field detectors 20a-d includes one or more audible devices 30 to provide an audio warning to the operators that the electric field detector 20a-d has detected an overvoltage. Non-limiting examples of an audible device 30 includes, but is not limited to, a speaker and/or a horn. In an embodiment, the electric field detector 20a-d includes a battery 32 for powering the electric field detector 20a-d. In an embodiment, the electric field detector 20a-d includes a power button 34. In an embodiment as shown in FIG. 2, the power button 34 is on a top of the housing 24. In an embodiment, the power button 34 is on a bottom of the housing 24.

Each electric field detector 20a-d includes a control apparatus 36. Attention is invited to FIG. 3 which illustrates a block diagram of a control apparatus 36 that may be implemented on each electric field detector 20a-d in accordance with some example embodiments. In this regard, when implemented on each electric field detector 20a-d, the control apparatus 36 enables each electric field detector 20a-d to energize the one or more illumination sources 28 and/or the one or more audible devices 30 to provide the warning to the operators, and to communicate with the other electric field detectors 20a-d in the system to provide a warning notification, in accordance with one or more example embodiments. It will be appreciated that the components, devices or elements illustrated in and described with respect to FIG. 3 below may not be mandatory and thus some may be omitted in certain embodiments. Additionally, some embodiments may include further or different components, devices or elements beyond those illustrated in and described with respect to FIG. 3.

The control apparatus 36 includes field detection circuitry 38 which is configured to detect voltage in the electric field in the environment 10 and to determine whether the detected voltage meets or exceeds the voltage threshold, and in response to the detection by the field detection circuitry 38 of an overvoltage and is configurable to perform actions in accordance with one or more example embodiments disclosed herein. The field detection circuitry 38 may include a processor 40 and, in some embodiments, such as that illustrated in FIG. 3 may further include memory 42. An example field detection circuitry 38 is manufactured by HD Electric Company, for example, as used in the WATCH-MAN® work area voltage detector, part number WM-01.

Figure 3:
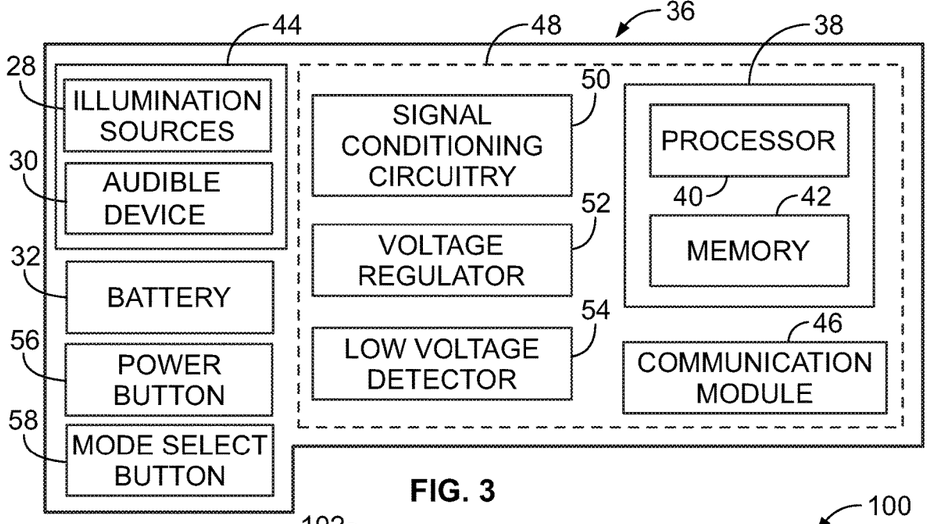
FIG. 3 is a block diagram of example control apparatus of the electric field detector.

The processor 40 may be embodied in a variety of forms. For example, the processor 40 may be embodied as various hardware-based processing means such as a microprocessor, a coprocessor, a controller or various other computing or processing devices including integrated circuits such as, for example, an ASIC (application specific integrated circuit), an FPGA (field programmable gate array), some combination thereof, or the like. Although illustrated as a single processor, it will be appreciated that the processor 40 may comprise a plurality of processors. The plurality of processors may be in operative communication with each other and may be collectively configured to perform one or more functionalities of the control apparatus 36 as described herein. In some example embodiments, the processor 40 may be configured to execute instructions that may be stored in the memory 42 or that may be otherwise accessible to the processor 40. Depending on the form of instructions that may be stored in the memory 42 or otherwise accessed by the processor 40, such execution of instructions may, for example, include execution of compiled executable code, translation or interpretation of stored program instructions, some combination thereof, or other method through which the processor 40 may read and execute computer program instructions. As such, whether configured by hardware or by a combination of hardware and software, the processor 40 is capable of performing operations according to various embodiments while configured accordingly.

The memory 42 can include one or more of a program memory, a cache, random access memory (RAM), a read only memory (ROM), a flash memory, a hard drive, etc., and/or other types of memory. In some example embodiments, the memory 42 may include one or more memory devices. Memory 42 may include fixed and/or removable memory devices. In some embodiments, the memory 42 may provide a non-transitory computer-readable storage medium that may store computer program instructions that may be executed by the processor 40. In some embodiments, the memory 42 may be configured to store information, data, applications, instructions (e.g., compiled executable program instructions, uncompiled program code, some combination thereof, or the like) and/or the like for enabling the control apparatus 36 to carry out various functions in accordance with one or more example embodiments.

The control apparatus 36 includes a warning module 44 in operative communication with the processor 40 and a communication module 46 in operative communication with the processor 40. The warning module 44 includes the electrical components for energizing the one or more illumination sources 28 and/or the one or more audible devices 30 to provide the warning to the operators. In some embodiments, the memory 42 may be in operative communication with one or more of the processor 40 and the warning module 44 via one or more buses for passing information among components of the control apparatus 36.

In some embodiments, some of the control apparatus 36 can reside on a printed circuit board assembly (PCBA) 48, or other type of electrical component assembly, e.g., a 3D printer process assembly mounted in the housing 24. It will be appreciated that where PCBA 48 is described, it is described by way of non-limiting example, such that alternative assemblies on which circuitry and/or other electronic components may be embodied may be substituted for PCBA 48 within the scope of the disclosure, including but not limited to variously configured point-to-point constructed circuits, application-specific integrated circuit (ASIC), field programmable gate array (FPGA), etc. In some embodiments, the field detection circuitry 38 is located on the PCBA 48.

Signal conditioning circuitry 50 can turn signals into digital signals before being received by the field detection circuitry 38. Additionally, or alternatively, the control apparatus 36 may include an onboard analog-to-digital converter and/or other circuitry that may be configured to convert analog signals into digital signals, e.g., for processing. In some embodiments, a voltage regulator 52 can supply a proper voltage from the battery 32 to the other components of the control apparatus 36. In some embodiments, a low voltage detector 54 can monitor a battery charge level of the battery 32 so that the electric field detector 20*a-d* can notify the operators, e.g., by activating the warning module 44, in a way that varies from the warning of the overvoltage to indicate a low battery charge level. A power button 56, which operators can use to turn on and off the electric field detector 20*a-d*, can also be used to verify the battery charge level when held down. Additional or fewer components may be included on the PCBA 48 depending on an implementation.

In this regard, the field detection circuitry 38 may be configured to perform and/or control performance of one or more functionalities of each electric field detector 20*a-d*, such as to energize and control operation of the warning module 44, in accordance with various example embodiments. The field detection circuitry 38 may be configured to perform data processing, application execution and/or other processing and management services according to one or more example embodiments.

In some embodiments, the control apparatus 36 or a portion(s) or component(s) thereof, such as the field detection circuitry 38, may include one or more chipsets and/or other components that may be provided by integrated circuits.

The communication module 46 is configured to receive the warning notification from one or more of the other electric field detectors 20*a-d* in the system, and is configured to communicate an indication of the warning notification to the field detection circuitry 38. In an embodiment, the communication module 46 is configured to process or modify the received warning notification and forward the processed or received warning notification to the field detection circuitry 38. Therefore, the electric field detectors 20*a-d* provide a warning to operators positioned in and/or around the environment 10 of an overvoltage, no matter which of the electric field detectors 20*a-d* first detected the overvoltage, via the warning modules 44.

In an embodiment, the electric field detectors 20*a-d* communicate by wireless communication. For wireless communications, the communication module 46 may include a transceiver, for example. In an embodiment, the electric field detectors 20*a-d* may communicate via an ad hoc (e.g., mesh) network that may be formed among electric field detectors 20*a-d* within range of each other, e.g., as established by the communication module 46. An example chip that may be provided and/or that may be integrated into the communication module 46 to enable communication over a radio frequency mesh network is provided by a Synapse Wireless, Inc. integrated circuit model number SM220UF1. However, it will be appreciated that other chips and controllers may be used within the scope of the disclosure.

In some embodiments, the electric field detectors 20*a-d* can act as repeaters to repeat the warning notifications of the overvoltage to other electric field detectors 20*a-d* within range even though the electric field detectors 20*a-d* are not within range of the electric field detector 20*a-d* originating the warning notification. In some embodiments, the electric field detectors 20*a-d* may connect and communicate with each other via a structured wireless LAN/PAN network with an access point or master unit. A master unit of the structured network, can, for example, be one of the electric field detectors, e.g. 20*a*, designated as a master.

Some non-limiting example of wireless communication technologies that may be used to facilitate formation of an ad hoc network, structured network, and/or direct wireless communication (e.g., peer-to-peer, or P2P) links between two or more electric field detectors 20*a-d* include one or more of an Institute of Electrical and Electronics Engineers (IEEE) 802.15 or other wireless personal area networking technology (e.g., ZigBee™, BLUETOOTH™, and/or the like), near field communication (NFC), IEEE 802.11 or other wireless local area networking communication technology (e.g., Wi-Fi), Wi-Fi Direct, Z-wave, WirelessUSB, WirelessHD, Wireless HART, ultra-wide band (UWB), Wireless Regional Area Network (WRAN), ISA100a, Radio Frequency Identification (RFID), Infrared (IR), ISM Band, IEEE 1802.15.4, ANT+, 6LoWPAN, Ultra-Wideband, satellite networks, cellular networks, etc. However, it will be appreciated that communication between two or more electric field detectors 20a-d may be provided by any wireless communication technology that may be used to form an ad hoc or structured wireless local area network (LAN), personal area network (PAN), direct (e.g., P2P) communication link or the like within the scope of the disclosure.

In response to detection of an overvoltage by one or more of the electric field detectors 20a-d, the electric field detectors 20a-d provide a warning to operators to the presence of the overvoltage in the environment 10 by activating its warning module 44 to provide the warning. In an embodiment, the field detection circuitry 38 of the electric field detectors 20a-d activates the one or more illumination sources 28 to provide a visual warning to the operators in the environment 10 and/or activates the one or more audible devices 30 to provide an audio warning, e.g., beeping, to provide a warning to operators around the electric field detectors 20a-d.

In an embodiment, if one electric field detector 20a detects overvoltage, then every electric field detector 20b-d indicates the same warning via the warning modules 44.

In an embodiment, if one electric field detector 20a detects overvoltage, then the electric field detector 20a indicates a warning, but the other electric field detector 20b-d indicate a different warning (e.g., different light color/pattern and/or audible tones/volumes/patterns, etc.) than the one indicated by the electric field detector 20a.

In an embodiment, multiple electric field detectors 20a and 20c detect the overvoltage and provide a different warning (e.g., different light color/pattern and/or audible tones/volumes/patterns, etc.) than the electric field detectors 20b and 20d that do not detect the overvoltage, but receive the warning notification and/or repeat the warning. The type of warning can be based on both the received warning notification as well as the voltage detected by the particular electric field detector.

In an embodiment, the electric field detectors 20a-d are configured to detect multiple voltage thresholds and the warnings provided by the warning modules 44 indicate field strength of the detected voltage. Multiple voltage thresholds can be assigned or dynamically chosen based on the current set of voltages observed in the system. For example, if a first voltage threshold is met, then the electric field detectors 20a-d provide a warning in a first way; if a second voltage threshold is met, then the electric field detectors 20a-d provide a warning in a second way which is different (e.g., different light color/pattern and/or audible tones/volumes/patterns, etc.) from the first way; etc. For example, the first way may use the one or more illumination sources 28 to flash at a first rate and/or the one or more audible devices 30 to beep at a first rate; and the second way may use the one or more illumination sources 28 to flash at a second rate which is different from the first rate and/or the one or more audible devices 30 to beep at a second rate which is different from the first rate; etc. As a more particular example, in some such embodiments, there may be a first voltage threshold and a second voltage threshold, with the second voltage threshold being higher than the first voltage threshold. A first electric field detector, for example electric field detector 20a, may detect a voltage exceeding the first voltage threshold, but not the second voltage threshold, and may provide a first warning (e.g., an orange light, a light pattern blinking at a first rate, and/or a first audible tones/volumes/patterns, etc.) while a second electric field detector, for example electric field detector 20b, may detect a voltage exceeding the second voltage threshold and may provide a second warning different than the first warning (e.g., a red light, a light pattern blinking at a second rate, and/or a second audible tones/volumes/patterns, etc.).

In an embodiment, when one electric field detector, for example electric field detector 20a, detects one of the voltage thresholds, a warning notification is sent to the other electric field detectors 20b-d that do not detect the overvoltage, and all of the electric field detectors 20a-d provide the same warning. In an embodiment, when one electric field detector 20a detects one of the voltage thresholds, a warning notification is sent to the other electric field detectors 20b-d that do not detect the overvoltage, and electric field detector 20a provides a different warning than the warnings provided by the other electric field detectors 20b-d. In an embodiment, one electric field detector 20a detects one of the voltage thresholds and send a warning notification to the other electric field detectors 20b-d, and another one of the electric field detectors 20b detects the same or a different voltage threshold and sends a warning notification to the other electric field detectors 20a, 20c, 20d; wherein electric field detector 20a provides a different warning than electric field detector 20b, and the remaining electric field detectors 20c, 20d provide further different warnings.

In each embodiment, the different types of warnings can be indicated by the electric field detectors 20a-d using the warning module 44 to provide varying lights, sounds or a combination of lights and sounds, including but not limited to a strength of the light or sound (e.g., a luminous intensity of the light; a loudness, such as may be measured in decibels of the sound; or the like), different light colors, different number of lights illuminated, different audio warning (louder/softer, different tones), etc., that indicate strength of voltage detected.

In an embodiment, the field detection circuitry 38 of each electric field detector 20a-d is configured to control the warning modules 44 such that the one or more illumination sources 28 provides constant illumination, varying illumination, and/or turn them on and off in a pattern, etc., to catch the attention of operators. For example, the electric field detector 20a-d can provide a heartbeat type pattern to indicate that it is actively checking for electric fields having voltage meeting or exceeding the voltage threshold, and a spinning pattern can indicate an electric field and nearby energized conductor.

In some embodiments, the electric field detectors 20a-d can communicate with other devices via the communication module 46, whether or not located in the environment 10, including but not limited to, smart phones, tablets, laptops, personal computers (PC), etc., with communication capability and which may operate on one of a variety of operating systems including but not limited to Microsoft Windows (a registered trademark of Microsoft Corporation), Apple iOS (a registered trademark of Cisco), Apple OSX, Google Android (a registered trademark of Google Inc.), or Linux (a registered trademark owned by Linus Torvalds). In some embodiments, the electric field detectors 20a-d communicates a warning notification to the other devices to alert a person that is not in the environment 10. In addition, the other devices may be used to assign voltage thresholds to the electric field detectors 20a-d.

In some embodiments, the electric field detector 20a-d may include a mode selection button 58 that can include independent mode select, coordinated mode select, or a selectable channel(s). For example, the electric field detector 20a-d operating in independent mode may only provide a warning if that electric field detector, for example electric field detector 20a, itself, detects voltage, and may not communicate with other electric field detectors 20a-d within range or at least may not repeat warnings from other electric field detectors 20a-d within range. Coordinated mode may set the electric field detector 20a-d to repeat a warning from an electric field detector 20a-d within range that has detected overvoltage. Channel selection may be provided in addition to or in lieu of coordinated mode. In channel select, the electric field detector 20a-d may include a plurality of channels, e.g., 1, 2, 3. For example, electric field detectors 20a-d within range of each other or that are connected to same network that are on channel 1 can display and/or sound warnings together. If one electric field detector 20a-d on channel 1 detects voltage, all electric field detectors on channel 1 can sound warnings, but electric field detectors 20a-d on channel 1 may not repeat any warning from an electric field detector 20a-d on channel 2 that detects overvoltage, such that an electric field detector, for example electric field detector 20a, on channel 2 in such embodiments may only display and/or sound a warning if it or another electric field detector, for example electric field detector 20b, on channel 2 detects overvoltage. The channels can be used to group electric field detectors 20a-d together in the environment 10, in which all electric field detectors 20a-d of a first portion of the environment 10 can coordinate separately from electric field detectors 20a-d in a second portion of the environment 10, as determined by the separate channels.

Figure 4:
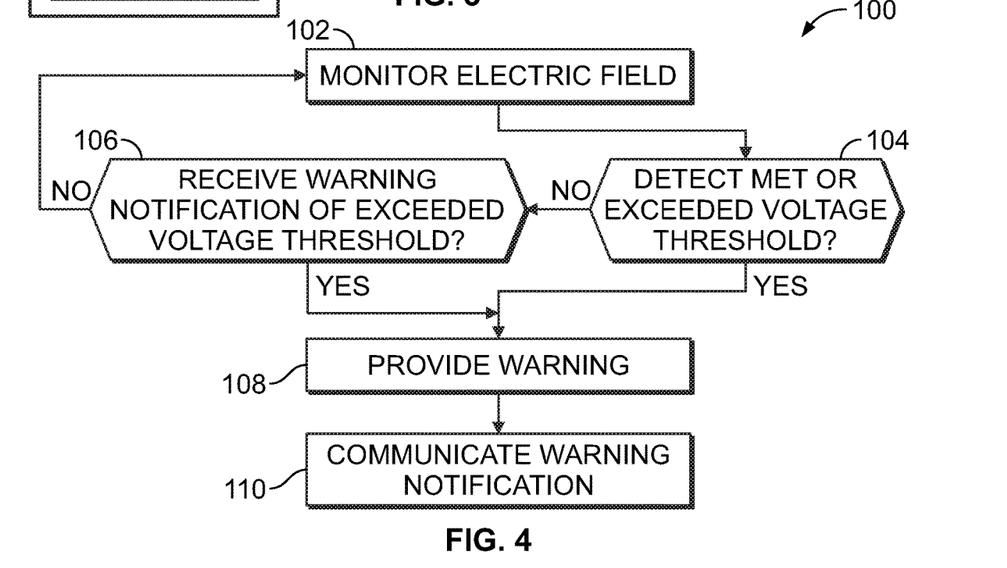
FIG. 4 is a flowchart of an example logic of the electric field detector.

FIG. 4 is a flowchart of an example logic 100 of an electric field detector, for example electric field detector 20a, in view of the environment 10. The electric field detector 20a, monitors an electric field in the environment 10 that the electric field detector 20a, is placed in (102) by detecting the voltage in the area around the electric field detector 20a. The electric field detector 20a, waits for the voltage threshold to be met and/or exceeded in that environment 10 (104). Additionally, or alternatively, the electric field detector 20a, can receive a warning notification from one or more other electric field detector(s), for example electric field detector 20b, 20c and/or 20d, in the environment 10 indicating that one or more other electric field detector(s) detected an overvoltage (106). Based on one or more of the electric field detectors detecting an overvoltage or receiving a warning notification from another electric field detector that an overvoltage was detected, the electric field detector 20a, provides a warning to the operators via the warning module 44, e.g. via the one or more illumination sources 28 and/or via the one or more audible devices 30 (108). The electric field detector(s) that detected the overvoltage communicates a warning notification to the other electric field detectors (110).

Figure 5:
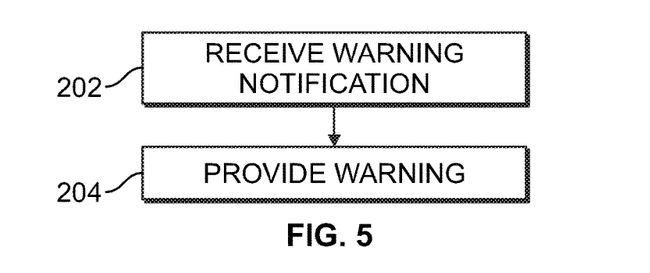
FIG. 5 is a flowchart of an example logic of the system.

FIG. 5 is a flowchart of an example logic 200 of a second electric field detector, for example electric field detector 20b, in view of the environment 10. The second electric field detector 20b, receives warning notification (202) from one of more of the other electric field detectors and in response, provides a warning to the operators via its warning module 44, e.g. via the one or more illumination sources 28 and/or via the one or more audible devices 30 (204).

The processing capability of the systems and processes described herein may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above. The systems and methods can be implemented over a cloud.

Figure 6:
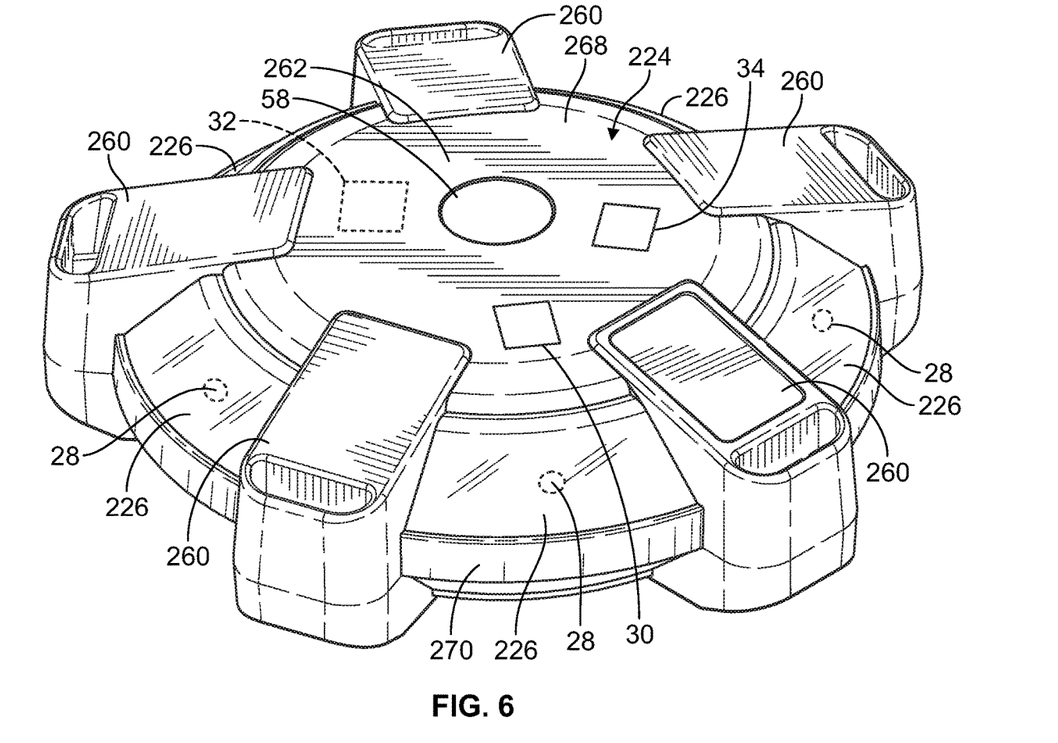
FIG. 6 is a perspective view of an example electric field detector.
Figure 7:
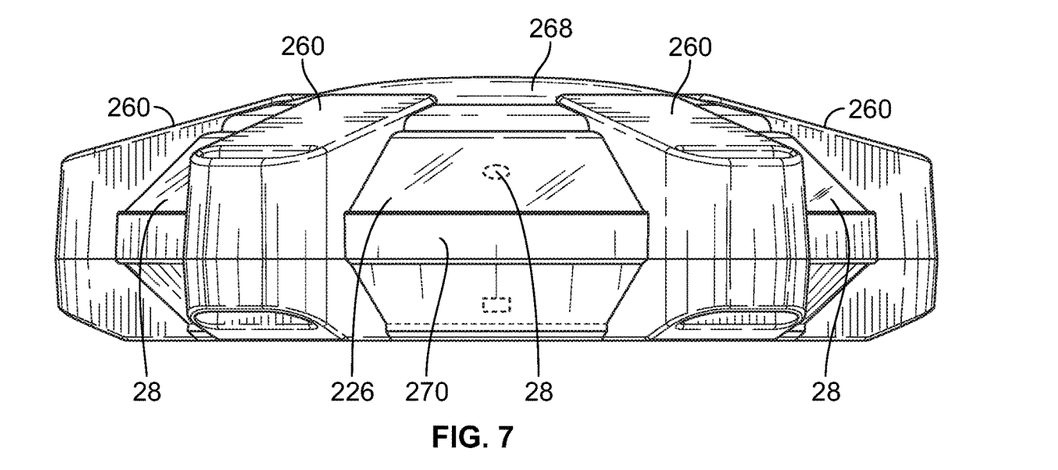
FIG. 7 is a side elevation view of the electric field detector of FIG. 6.
Figure 8:
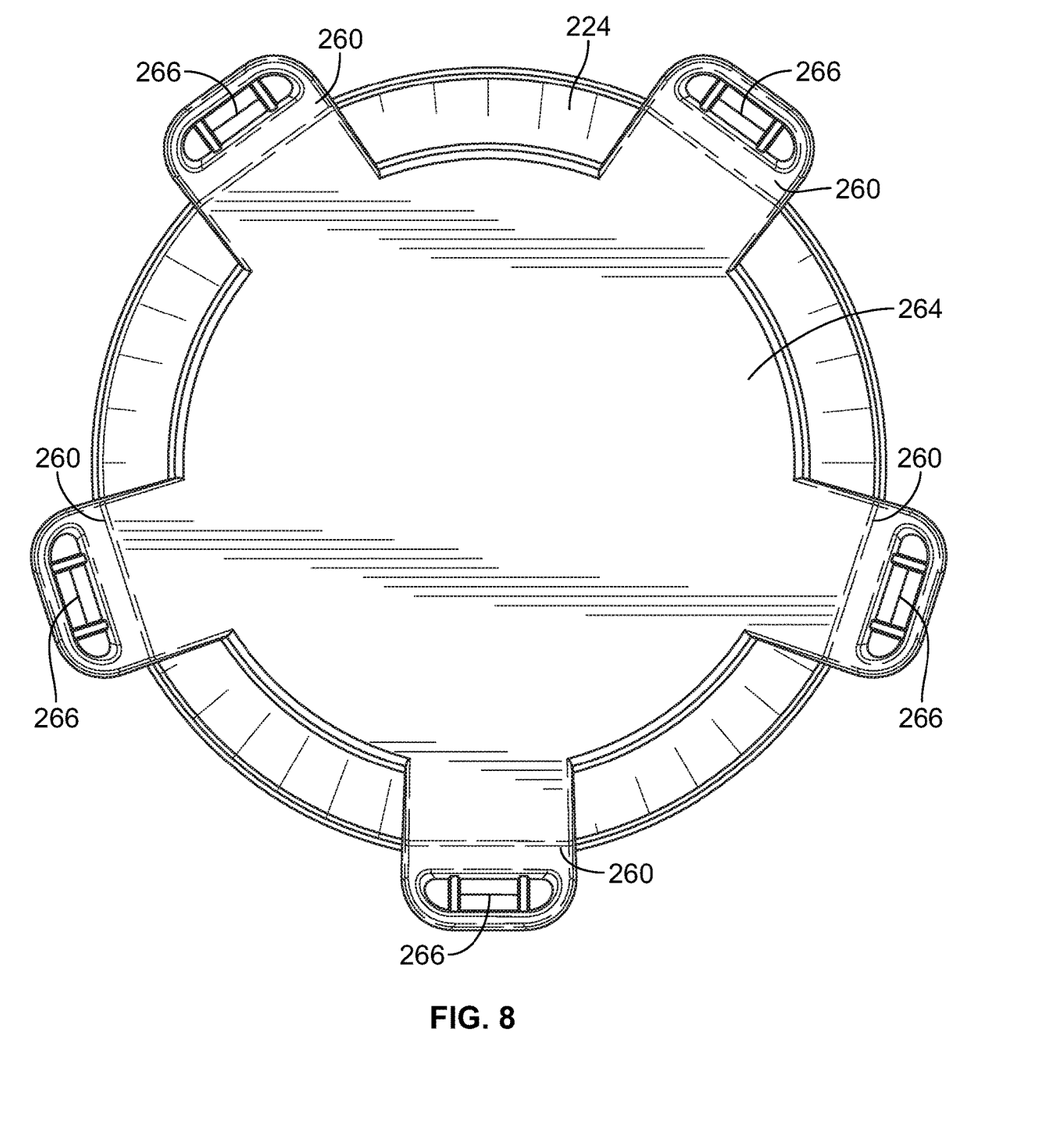
FIG. 8 is a bottom plan view of the electric field detector of FIG. 6.

In an embodiment as shown in FIGS. 6-8, the housing 224 is generally circularly-shaped housing 224 and includes legs 260 extending from a central hub 262. In some embodiments that shape can be oblong to provide an asymmetric shape around any vertical axis, e.g., to provide a more uniform voltage detection in all directions. Other shapes can be used, e.g., square, rectangular, triangular, rhombus, etc. At the bottom 264 of the housing 224, see FIG. 8, the legs 260 can include bars 266, e.g., for providing access points to mounting mechanisms to mount the electric field detector 20a in the environment 10. For example, straps or ropes can be weaved through the bars 266 to strap the electric field detector 20a to the environment 10. Additionally, or alternatively, the bars 266 can mate with corresponding female connectors attached in the environment 10, etc., to secure the electric field detector 20a to the environment 10. It will be appreciated, however, that additional or alternative mounting mechanisms can be used to mount an electric field detector 20a-d within an environment 10 within the scope of the disclosure. In an embodiment, the generally transparent or translucent covers 226 are positioned between the legs 260, and from a top 268 to a side 270 around the perimeter of the housing 224, e.g., to be visible from any direction. In some embodiments, the covers 226 can be angled, e.g., from the top 268 to the side 270, to provide a greater surface area of visible light.

Figure 9:
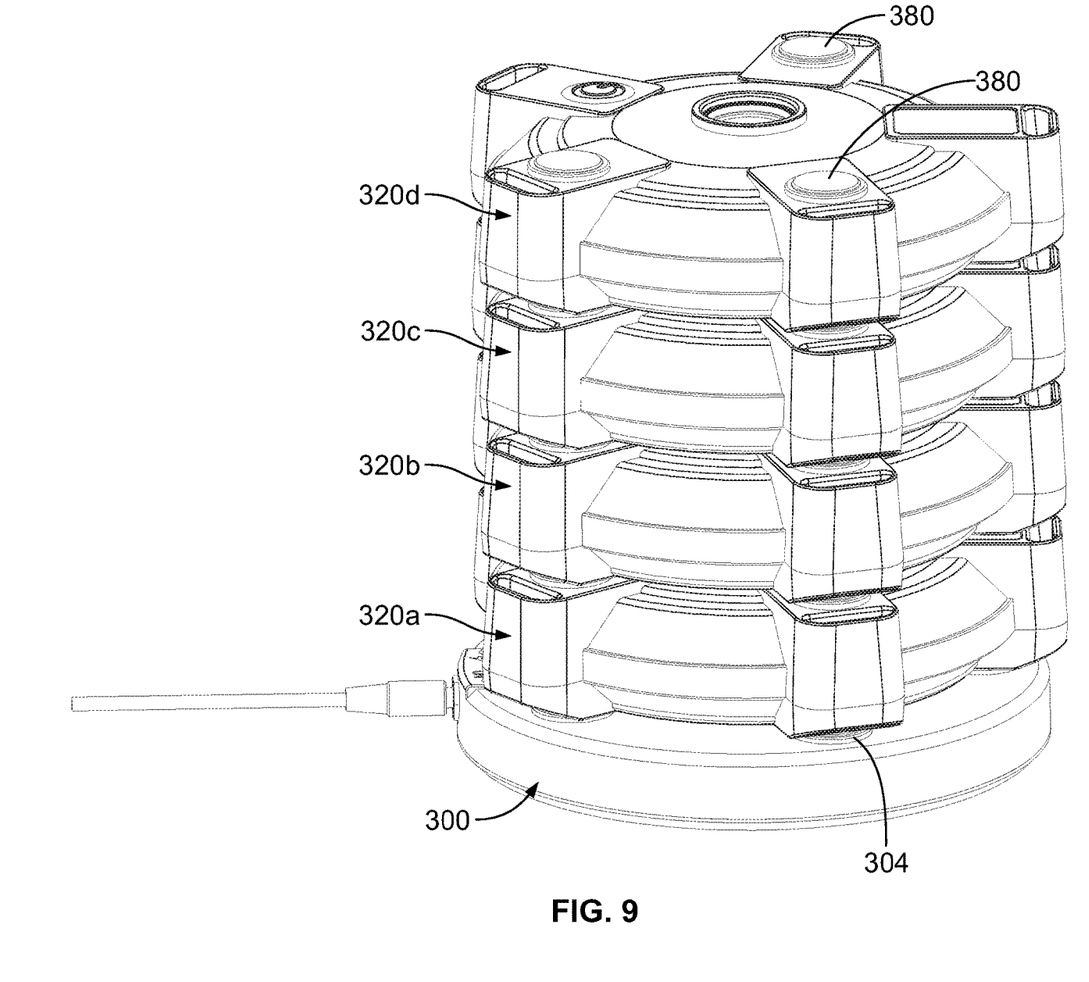
FIG. 9 is a perspective view of an example stack of electric field detectors mounted onto a charging station to charge batteries of the electric field detectors.
Figure 10:
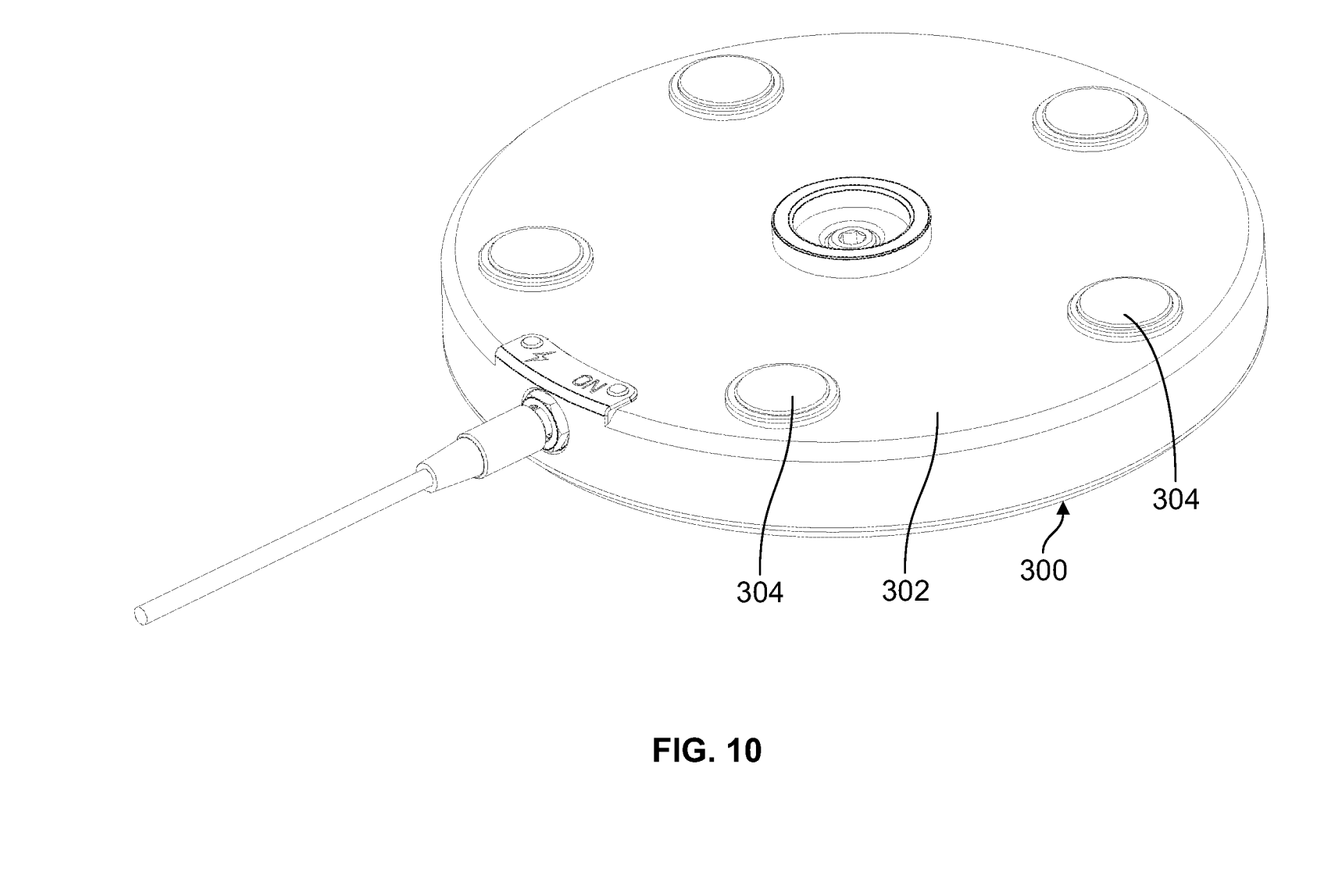
FIG. 10 is a perspective view of an example charging station.
Figure 11:
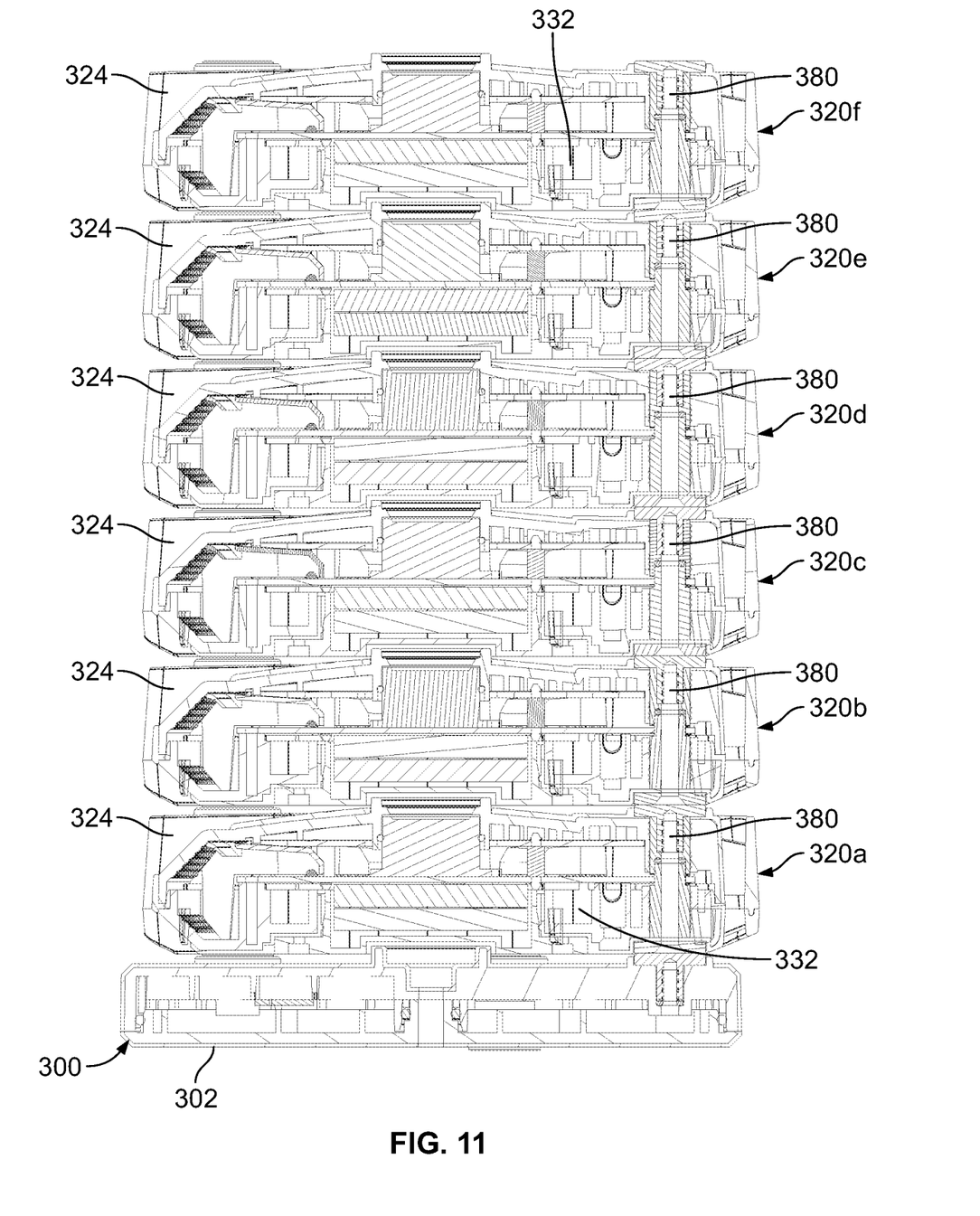
FIG. 11 is a cross-sectional view of the example stack of electric field detectors mounted onto the charging station.

In an embodiment, as shown in FIGS. 9-11, the electric voltage detectors 320a-f can be stacked onto each other and onto a charging station 300 to charge the batteries 332. In an embodiment, the charging station 300 includes a base 302 and plurality of charge pads 304 provided thereon. Each electric voltage detectors 320a-f has at least one contact 380 that extends through the housing 324 and is in electrical communication with the battery 332. During charging, the contact(s) 380 on the lowermost electric voltage detector 320a engages the charge pad(s) 304 on the charging station 300. The contact(s) 380 on the stacked electric voltage detectors 320a-f engage one another to provide a continuous electrical path. When the charging station 300 is activated, all of the batteries 332 of the electric voltage detectors 320a-f are charged. The electric voltage detectors 320a-f are removed from each other and the charging station 300 for use in the environment 10.

While the voltage threshold is described herein as a voltage meeting a certain voltage, the system could be modified to provide a warning if no voltage is detected.

While particular embodiments are illustrated in and described with respect to the drawings, it is envisioned that those skilled in the art may devise various modifications without departing from the spirit and scope of the appended claims. It will therefore be appreciated that the scope of the disclosure and the appended claims is not limited to the specific embodiments illustrated in and discussed with respect to the drawings and that modifications and other embodiments are intended to be included within the scope of the disclosure and appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the disclosure and the appended claims.

What is claimed is:

1. A system provided in an environment, comprising:
a first electric field detector operably connected with first field detection circuitry configured to detect a voltage in an electric field in the environment which meets or exceeds a voltage threshold;
a first communication module operably connected with the first field detection circuitry;
a first warning module operably connected with the first field detection circuitry and configured to provide a warning to operators based on the voltage meeting or exceeding the voltage threshold;
a second electric field detector operably connected with second field detection circuitry configured to detect a voltage in an electric field in the environment which meets or exceeds a voltage threshold;
a second communication module operably connected with the second field detection circuitry;
a second warning module operably connected with the second field detection circuitry and configured to provide a warning to operators based on the voltage meeting or exceeding the voltage threshold;
the first communication module configured to communicate a warning notification to the second electric field detector; and
the second communication module configured to receive the warning notification, and in response, communicate the received warning notification to the second field detection circuitry so as to provide the warning to operators based on the voltage meeting or exceeding the voltage threshold, via the second warning module.

2. The system of claim 1, wherein at least one of the first and second field detection circuitry is provided in a housing and further comprising a mounting mechanism configured to mount the housing in the environment.

3. The system of claim 1, wherein at least one of the first and second warning modules is configured to provide at least one of an audio warning and a visual warning.

4. The system of claim 3, wherein at least one of the first and second warning modules is configured to provide different warnings for electric fields having differing strengths.

5. The system of claim 1, wherein at least one of the first and second warning modules is configured to provide different warnings for electric fields having differing strengths.

6. The system of claim 1, wherein the second communication module is configured to receive the warning notification from the first electric field detector if the second communication module is on a same channel as the first electric field detector.

7. The system of claim 1, where the second communication module is configured to establish an ad hoc network with the first electric field detector.

8. The system of claim 1, wherein at least one of the first electric field detector and the second electric field detector are removably mounted in the environment.

9. The system of claim 1, wherein the first electric field detector and the second electric field detector are configured to be stacked on top of each other and stacked on a charging station, wherein the first and second electric field detectors are electrically connected to each other and to the charging station when the first and second electric field detectors are stacked onto the charging station.

10. The system of claim 1, wherein the first communication module is configured to wirelessly communicate the warning notification to the second electric field detector, and the second communication module configured to wirelessly receive the warning notification.

* * * * *